(12) United States Patent
Jeong

(10) Patent No.: US 7,936,636 B2
(45) Date of Patent: May 3, 2011

(54) SEMICONDUCTOR MEMORY DEVICE AND METHOD FOR REDUCING CURRENT CONSUMPTION BY CONTROLLING TOGGLING OF CLOCK

(75) Inventor: Chun-Seok Jeong, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 231 days.

(21) Appl. No.: 12/164,289

(22) Filed: Jun. 30, 2008

(65) Prior Publication Data

US 2009/0274001 A1    Nov. 5, 2009

(30) Foreign Application Priority Data

Apr. 30, 2008    (KR) .......................... 10-2008-0040905

(51) Int. Cl.
*G11C 8/00*    (2006.01)
(52) U.S. Cl. ................. 365/233.1; 365/233.13; 327/158
(58) Field of Classification Search ............... 365/233.1, 365/233.13, 233.18, 233.1 O, 233.13 X; 327/158, 327/158 X
See application file for complete search history.

(56) References Cited

U.S. PATENT DOCUMENTS

| | | | | |
|---|---|---|---|---|
| 6,381,194 B2* | 4/2002 | Li | ............................. | 365/233.11 |
| 6,987,699 B2* | 1/2006 | Lee | ............................... | 365/194 |
| 7,173,866 B2* | 2/2007 | Na et al. | ........................ | 365/193 |
| 7,365,583 B2* | 4/2008 | Shin | .............................. | 327/158 |
| 7,446,579 B2* | 11/2008 | Kim et al. | ..................... | 327/158 |

FOREIGN PATENT DOCUMENTS

KR    1020040095969 A    11/2004
KR    1020050041607 A    5/2005

OTHER PUBLICATIONS

Notice of Allowance issued from Korean Intellectual Property Office on Oct. 23, 2009.

\* cited by examiner

*Primary Examiner* — VanThu Nguyen
(74) *Attorney, Agent, or Firm* — IP & T Group LLP

(57) ABSTRACT

Semiconductor memory device and method for operating the same includes a data output unit configured to output data in synchronization with a data output clock and a clock control unit configured to selectively transfer the data output clock to the data output unit under the control of a read command.

17 Claims, 10 Drawing Sheets

SEMICONDUCTOR MEMORY DEVICE AND METHOD FOR REDUCING CURRENT CONSUMPTION BY CONTROLLING TOGGLING OF CLOCK

CROSS-REFERENCE TO RELATED APPLICATION

The present invention claims priority of Korean patent application number 10-2008-0040905, filed on Apr. 30, 2008, which is incorporated by reference in its entirety.

BACKGROUND OF THE INVENTION

The present invention relates to a semiconductor memory device, and more particularly, to a technique for reducing current consumption of a semiconductor memory device by controlling toggling of a clock.

FIG. 1 is a block diagram illustrating a DQ peripheral circuit and a clock tree in a conventional double data rate version 3 (DDR3) semiconductor memory device.

In general, the semiconductor memory device includes an AC peripheral circuit, and a DQ peripheral circuit. The AC peripheral circuit includes pads for receiving an address, a command and a clock, a clock buffer, and a command decoder. The DQ peripheral circuit refers to a region where data input/output pads and circuits for controlling the pads are gathered.

A delay locked loop (DLL) 110 of the AC peripheral circuit is used to compensate a skew between an external clock and an internal clock in the semiconductor memory device. The DQ peripheral circuit controls data output using rising and falling clocks RCLKDLL and FCLKDLL output from the DLL 110.

The rising clock RCLKDLL and the falling clock FCLKDLL output from the DLL 110 have a 180-degree phase difference. Rising and falling clocks RCLKDLL and FCLKDLL having a 180-degree phase difference are used because if a duty cycle changes during clock transfer in the case where just one clock is transferred to the DQ peripheral circuit, operation timing of a control circuit using a falling edge of the clock becomes mismatched.

The DQ peripheral circuit includes a domain crossing unit 120 and a clock transfer unit 130.

The clock transfer unit 130 transfers the rising clock RCLKDLL and the falling clock FCLKDLL output from the DLL 110 to a first buffer unit 140 and a second buffer unit 150. The semiconductor memory device may operate in an x8 mode or an x16 mode according to the number of data input/output pins (DQ pin) being used. In the x8 mode, the clock transfer unit 130 transfers the rising clock RCLKDLL and the falling clock FCLKDLL only to the first buffer unit 140. This is because data is output using only eight data pins. In the x16 mode, the clock transfer unit 130 transfers the rising clock RCLKDLL and the falling clock FCLKDLL to the first buffer unit 140 and the second buffer unit 150. It should be noted that although the clocks are distinguished by letters L and U in order to distinguish clocks being transferred to the first buffer unit 140 from clocks being transferred to the second buffer unit 150, but those clocks are fundamentally identical to each other.

The first buffer unit 140 supplies a rising clock RCLKDLL and a falling clock FCLKDLL to data output units 161 to 168, and the second buffer unit 150 supplies a rising clock RCLKDLL and a falling clock FCLKDLL to data output units 169 to 176. Then, the data output units 161 to 176 align data at the rising clock RCLKDLL and the falling clock FCLKDLL to output data to the outside of the semiconductor memory device. The data output units 161 to 176 refer to a circuit for controlling data output, such as a pipe latch that aligns and outputs data such that the data can be output to the data pin (DQ pin).

The domain crossing unit 120 is a circuit that generates an internal read command LATENCY synchronized with an internal clock RCLKDLL in response to a read command RDCMD input in synchronization with an external clock CLK. This is because in a read operation of the semiconductor memory device, the operation must be performed with reference to the internal clock RCLKDLL or FCLKDLL, which is an output clock of the DDL 110.

FIG. 2 is block diagram illustrating internal blocks of the domain crossing unit 120 of FIG. 1.

The domain crossing unit 120 includes a DLL counter 240, an EXT counter 260, a comparator 270, an initializer 220, a D flip-flop 210, a latch 250, and a replica 230.

An OERST signal OERST is a signal that enables the domain crossing unit 120. The initializer 220 is a circuit that determines an initial value of the DLL counter 240 according to a CAS latency CL<5:11> set in a mode resistor set (MRS). DDR3 supports CL5 to CL11. The replica 230 is a delay circuit based on skew-modeling between an external clock CLK and an internal clock RCLKDLL of the semiconductor memory device. Thus, the replica 230 has a delay value equal to the skew between the external clock CLK and the internal clock RCLKDLL.

The domain crossing will now be described. When the OERST signal OERST, i.e., an enable signal, is enabled, the D flip-flop 210 latches the OERST signal OERST in synchronization with a falling edge of the internal clock RCLKDLL. Then, a DLLRST signal DLLRST output as a result of the latching of the OERST signal OERST by the D flip-flip 210 enables the initializer 220. The initializer 220 enables the DLL counter 240. The DLL counter 240 increases a DLL counter code value DLLCNT<2:0> from an initial value set by the initializer 220 whenever the internal clock RCLKDLL is enabled. The DLLRST signal DLLRST is delayed by the skew between the external clock CLK and the internal clock RCLKDLL while passing through replica 230, and latched to the latch (D-LATCH) 250. An EXRST signal EXRST latched by the latch 250 enables the EXT counter 260. The EXT counter 260 increases an EXT counter code value EXTCNT<2:0> whenever the external clock CLK is enabled. Unlike the DLL counter 240, the EXT counter 260 has an initial value of zero.

The comparator 270 stores the EXT counter code value EXTCNT<2:0> of the EXT counter 260 at the moment when a read command RDCMD is enabled. The comparator 270 enables an internal read command LATENCY at the moment when the DLL counter code value DLLCNT<2:0> becomes equal to the stored EXT counter code value EXTCNT<2:0>.

FIG. 3 is a timing diagram illustrating the operation of the domain crossing unit 120.

Specifically, FIG. 3 illustrates domain crossing in the case of CL=6. If the internal read command LATENCY must be generated at CL-3, which means the time after three clock periods elapse from the input of an external read command RD because CL=6, that is, if the internal read command LATENCY is enabled three clock periods before data output and thus the data output must be prepared, an initial value of the DLL counter code value DLLCNT<2:0> is set to five. The DLLRST signal DLLRST and the EXTRST signal EXTRST signal are enabled with a time difference as long as a skew (tDLL) between an external clock and an internal clock. Then the DLL counter code value DLLCNT<2:0> is counted from the initial value five, and the EXT counter code value EXTCNT<2:0> is counted from the initial value, zero.

When the read command RDCMD is applied in this state, the EXT code value EXTCNT<2:0> is stored in response to the read command RDCMD, e.g., "two" is stored in the case of FIG. 3. The internal read command LATENCY is enabled at the moment when the DLL counter code value DLLCNT<2:0> becomes equal to the stored EXT code value EXTCNT<2:0>, which is two.

In FIG. 3, the internal read command LATENCY is enabled at the point CL-3. This means that the DQ peripheral circuit begins preparation for data output three clock periods before the actual data output.

Meanwhile, in semiconductor memory devices, operating frequencies increase as operation speeds gets higher from DDR2 to DDR3, and current consumption also increases because of clock toggling at a higher rate. Referring to FIG. 1 the rising and falling clocks RCLKDLL and FCLKDLL output from the DLL 110 are transferred to the first clock buffer unit 140 and the second clock buffer unit 150 through the clock transfer unit 130 and then are transferred to each of the data output units 161 to 176. Accordingly, all the blocks illustrated in the DQ peripheral circuit of FIG. 1 continuously consume current because of continuous toggling of the rising and falling clocks RCLKDLL and FCLKDLL.

SUMMARY OF THE INVENTION

Embodiments of the present invention are directed to reducing current consumption of a semiconductor memory device by preventing unnecessary toggling of clocks in a DQ peripheral circuit of the semiconductor memory device.

In accordance with an aspect of the present invention, there is provided a data output unit configured to output data in synchronization with a data output clock and a clock control unit configured to selectively transfer the data output clock to the data output unit under the control of a read command.

In accordance with another aspect of the present invention, there is provided a clock correction circuit configured to output a rising clock and a falling clock, wherein one of the rising clock and the falling clock is selectively output under the control of a read command, a data output unit configured to output data in synchronization with a data output clock and a clock control unit configured to selectively transfer the rising clock and the falling clock to the data output unit as the data output clock, under the control of the read command.

In accordance with yet another aspect of the present invention, there is provided a semiconductor memory device, comprising a DQ peripheral circuit using an output clock for domain crossing of a read command and for data output, wherein the output clock for the data output is supplied only during a read operation, except the output clock for the domain crossing.

In accordance with still another aspect of the present invention, there is provided receiving a read command, using the received read command to define a period of preparing data output and a period of outputting data to the outside of the semiconductor memory device as a period of providing an output clock and providing the output clock for the data output during the defined period.

DESCRIPTION OF SPECIFIC EMBODIMENTS

Hereinafter, a semiconductor memory device and a method for operating the same in accordance with the present invention will be described in detail with reference to the accompanying drawings.

Figure 4:
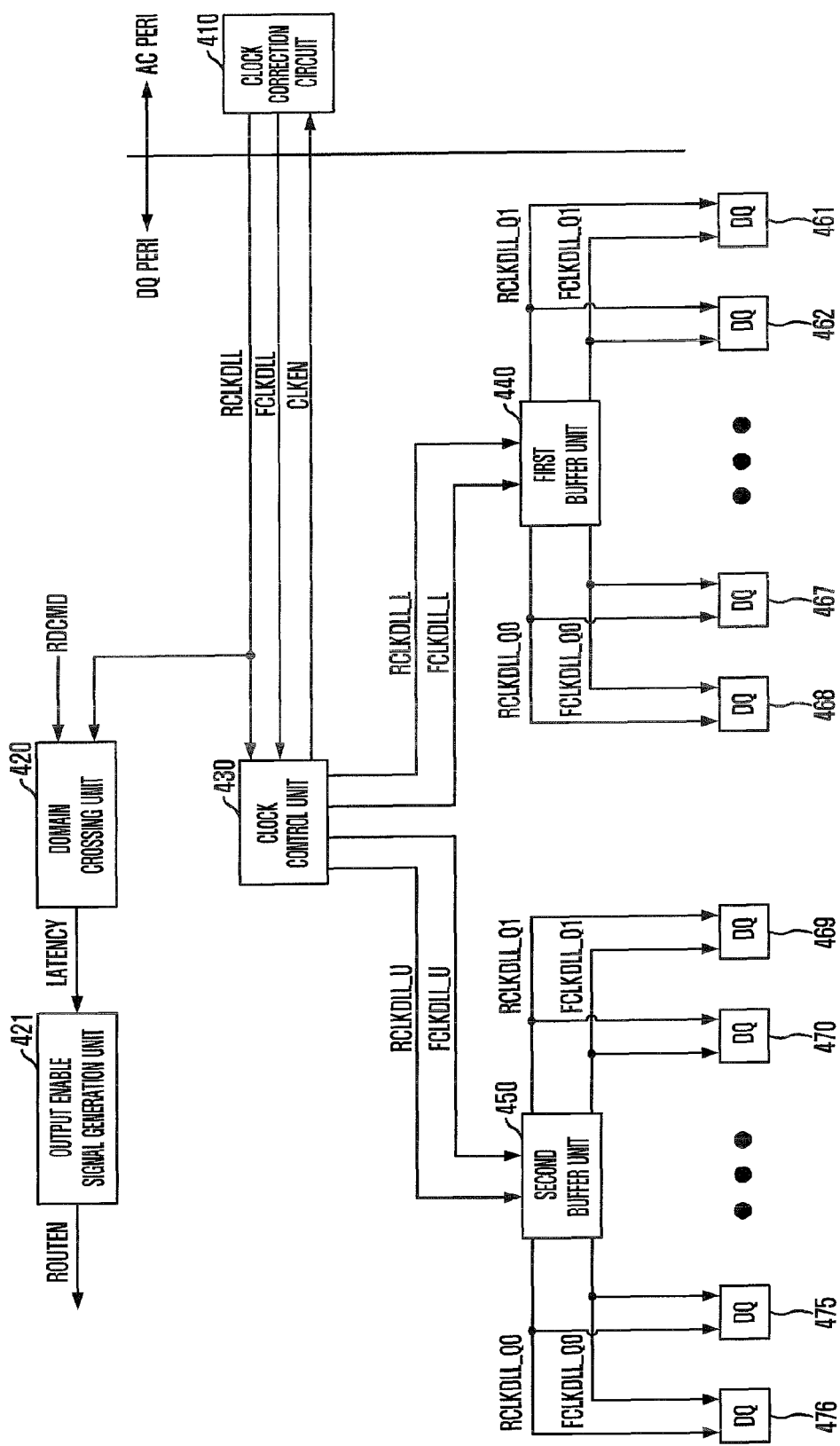
FIG. 4 is a block diagram illustrating a DQ peripheral circuit and a clock tree of a semiconductor memory device in accordance with an embodiment of the present invention.

FIG. 4 is a block diagram of a DQ peripheral circuit of a semiconductor memory device in accordance with an embodiment of the present invention.

The semiconductor memory device in accordance with an embodiment of the present invention includes data output units 461 to 476 outputting data in synchronization with data output clocks RCLKDLL and FCLKDLL, and a clock control unit 430 selectively transferring the data output clocks RCLKDLL and FCLKDLL to the data output units 461 to 476 under the control of a read command RDCMD. The semiconductor memory device may further include a first buffer unit 440 receiving data output clocks RCLKDLL_L and FCLKDLL_L output from the clock control unit 430 and outputting data output control clocks RCLKDLL_Q0, RCLKDLL_QL, FCLKDLL_Q0 and FCLKDLLQ1 to the data output units 461 to 468. A second buffer unit 450 receiving data output clocks RCLKDLL_U and FCLKDLL_U output from the clock control unit 430 and outputting data output control clocks RCLKDLL_Q0, RCLKDLL_Q1, FCLKDLL_Q0 and FCLKDLLQ1 to the data output units 469 to 476.

A domain crossing unit 420 performs domain crossing on the read command RDCMD that is input in synchronization with an external clock CLK, and generates an internal read command LATENCY synchronized with an internal clock RCLKDLL.

An output enable signal generation unit 421 generates an output enable signal ROUTEN in response to the internal read command LATENCY. The output enable signal ROUTEN is enabled after being delayed by a predetermined clock after the internal read command LATENCY is enabled. The output enable signal is enabled for a period as long as a burst length (BL).

The internal read command LATENCY is a signal for allowing the semiconductor memory device to begin preparation for data output. The output enable signal ROUTEN is a signal for determining timing when data is actually output from the semiconductor memory device. That is, the internal read command LATENCY is a signal associated with a preparation operation for data output, and the output enable signal ROUTEN is a signal associated with a data output operation.

The embodiment of the present invention is roughly characterized by the following two features in order to reduce current consumption of the semiconductor memory device.

The first feature of the embodiment of the present invention will now be described. Data output clocks RCLKDLL and FCLKDLL are transferred to the data output units 461 to 476 only in a read operation. The data output clocks RCLKDLL and FCLKDLL are used only during the read operation where data is output to the outside of the semiconductor memory device, and not used in a write operation. In the write operation, there is no need to use the data output clocks RCLKDLL and FCLKDLL which are internal clocks of the semiconductor memory device because a data strobe signal (DQS/DQSB) and data are input together from the outside of the semiconductor memory device.

The data output clocks RCLKDLL and FCLKDLL are necessary only for the read operation. However, in the related art, the data output clocks RCLKDLL and FCLKDLL are input for toggling to the data output units 461 to 476 all the time regardless of the read or write operation. Therefore, the data output units 461 to 476 continuously consume current even during a period that does not relate to the data output operation. However, in accordance with the embodiment of the present invention, unnecessary current consumption does not occur in the data output units 461 to 476 during operations other than the read operation because the data output clocks RCLKDLL and FCLKDLL are transferred to the data output units 461 to 475 only during the read operation.

The transfer of the data output clocks RCLKDLL and FCLKDLL to the data output units 461 to 475 only in the read operation is performed under the control of the clock control unit 430. When the read command RDCMD is input, the semiconductor memory device must perform a preparation operation for data output, such as data alignment. After the preparation operation such as the data alignment, data must be actually output. That is, the read operation may be divided into an operation of preparing the data output and an operation of actually outputting data. The clock control unit 430 in accordance with the embodiment of the present invention supplies a data output clock to the data output units 461 to 476 only while data to be output is being prepared and actually being output.

The clock control unit 430 determines a period for which the data output clocks RCLKDLL and FCLKDLL are to be supplied, by using the read command RDCMD, the internal read command LATENCY, and the output enable signal ROUTEN. Because both the internal read command LATENCY and the output enable signal ROUTEN are generated from the read command RDCMD, the clock control unit 430 may be considered to be under the control of the read command RDCMD. Detailed description of the clock control unit 430 will be made later with reference to accompanying drawings.

Figure 1:
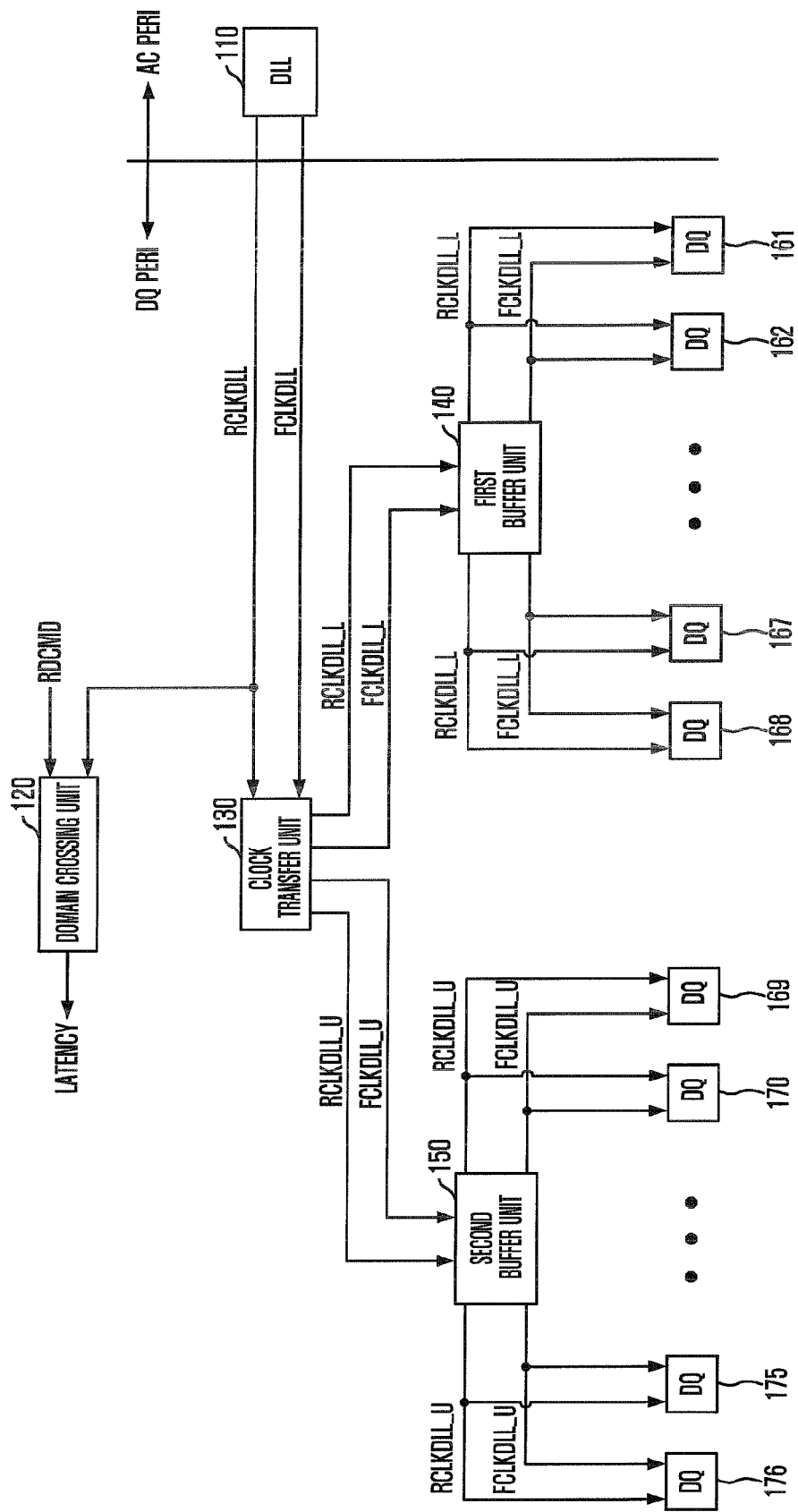
FIG. 1 is a block diagram illustrating a DQ peripheral circuit and a clock tree of a conventional DDR3 semiconductor memory device.
Figure 2:
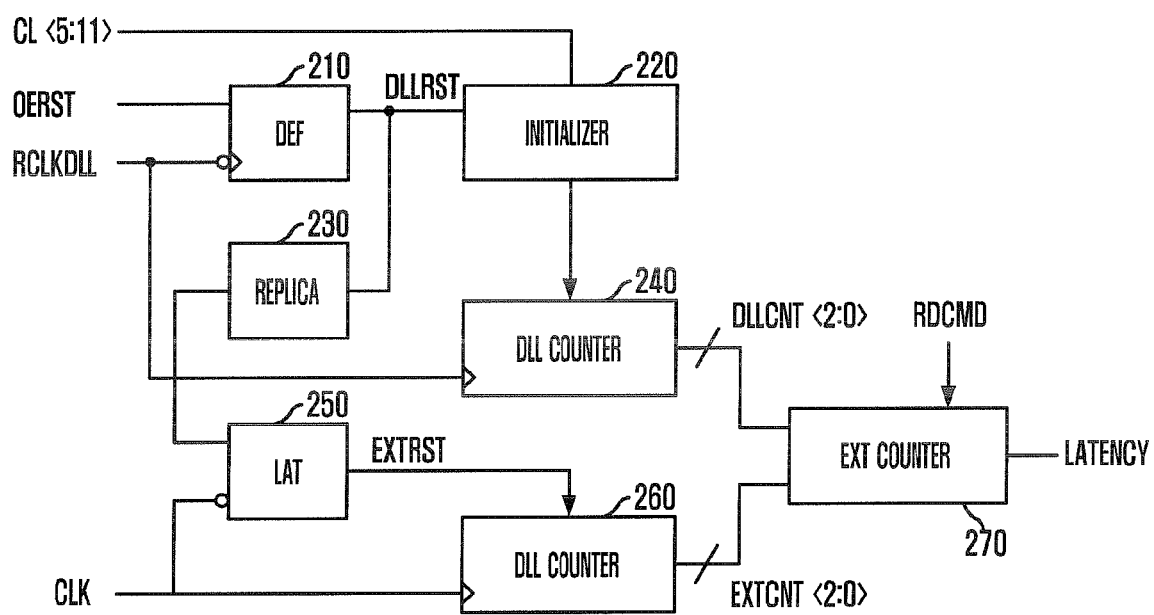
FIG. 2 is a block diagram illustrating internal blocks of a domain crossing unit of FIG. 1.
Figure 3:
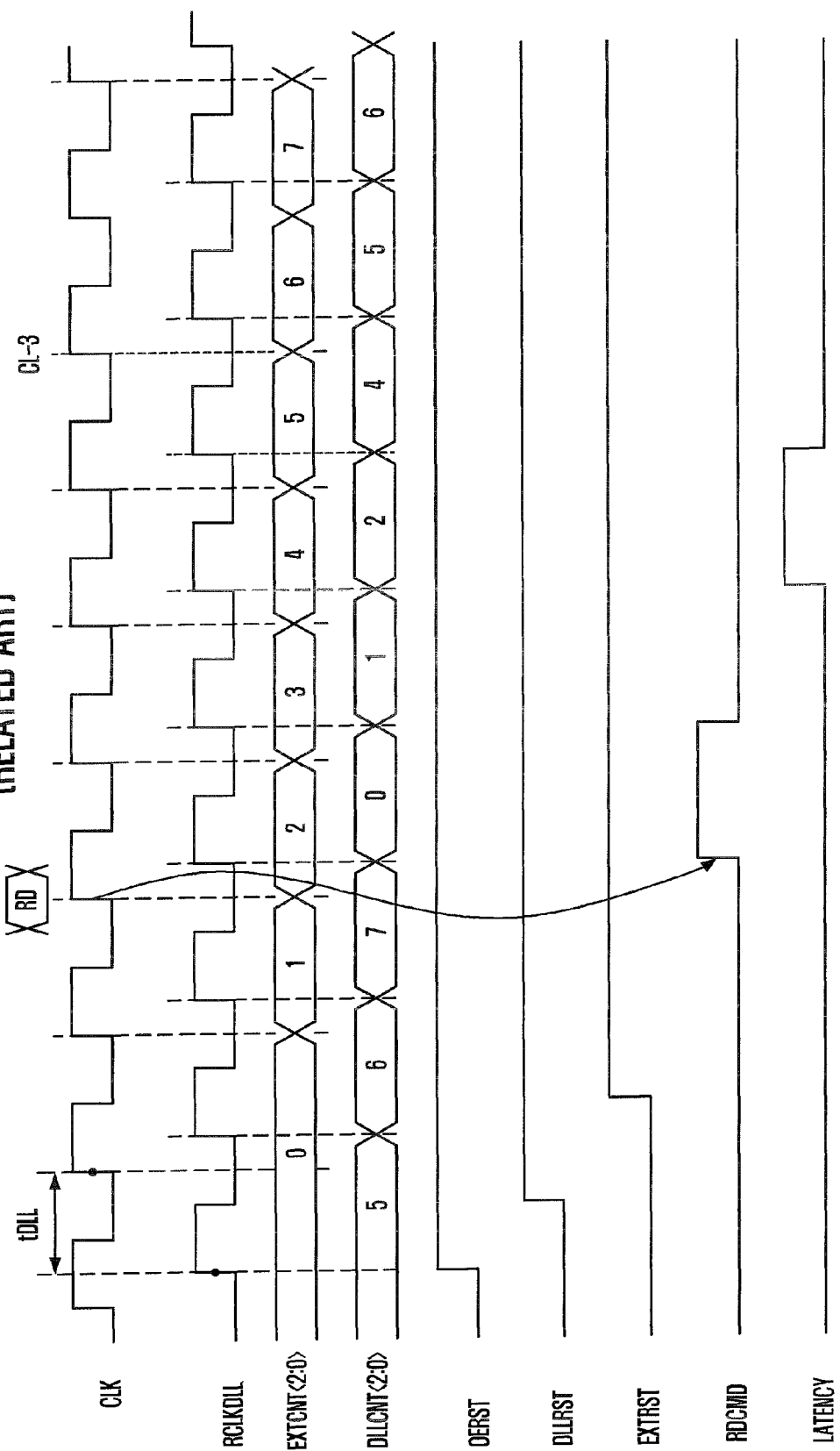
FIG. 3 is a timing diagram illustrating the operation of the domain crossing unit of FIG. 1.

The second feature of the embodiment of the present invention will now be described. The domain crossing unit 420, which is the same as the conventional domain crossing unit described with reference of FIGS. 2 and 3 counts an external clock CLK and an internal clock RCLKDLL. The internal clock RCLKDLL is identical to the above data output clock but the different term 'internal' is used instead of 'data output' to distinguish the data output clock from the external clock. Upon input of the read command RDCMD, the domain crossing unit 420 counting the external clock CLK and the internal clock RCLKDLL must perform domain crossing on the input read command RDCMD to generate the internal read command LATENCY. That is, in the domain crossing unit 420, the internal clock RCLKDLL must toggle and be input all the time even during an operation other than the read operation.

For this reason, a clock correction circuit 410 providing the internal clock RCLKDLL to the domain crossing unit 420 must be enabled all the time.

However, the domain crossing unit 420 does not use both a rising clock RCLKDLL and a falling clock FCLKDLL output from the clock correction circuit 410. The domain crossing unit 420 uses just one of the rising clock RCLKDLL and the falling clock FCLKDLL as an internal clock. In the drawing, the rising clock is used. In this case, current consumption can be additionally reduced since it is possible to prevent the remaining clock, which is not used by the domain crossing unit 410 among the rising clock RCLKDLL and falling clock FCLKDLL, from being output from the clock correction circuit 410 during an operation that is not the read operation.

The clock control unit 430 outputs a clock enable signal CLKEN enabled in the read operation to the clock correction circuit 410. A clock output circuit of the clock correction circuit 410 outputs both the rising clock RCLKDLL and the falling clock FCLKDLL while the clock enable signal CLKEN is enabled. However, while the clock enable signal CLKEN is disabled, the clock output circuit of the clock correction circuit 410 does not output one of the rising clock RCLKDLL and falling clock FCLKDLL, which is not used by the domain crossing unit 420.

For example, if the domain crossing unit 420 uses the rising clock RCLKDLL, the clock output circuit within the clock correction circuit 410 outputs both the rising clock RCLKDLL and the falling clock FCLKDLL while the clock enable signal CLKEN is enabled. However, while the clock enable signal CLKEN is disabled, the clock output circuit stops toggling of the falling clock FCLKDLL and outputs just the rising clock RCLKDLL. In contrast, if the domain crossing unit 420 uses the falling clock FCLKDLL, the clock output circuit within the clock correction circuit 410 outputs both the rising clock RCLKDLL and the falling clock FCLKDLL while the clock enable signal CLKEN is enabled. However, while the clock enable signal CLKEN is disabled, the clock output circuit stops toggling of the rising clock RCLKDLL and outputs just the falling clock FCLKDLL.

The clock correction circuit 410 refers to a circuit, such as a delay locked loop (DLL), used for generating an internal clock the semiconductor memory device uses for data output. Most semiconductor memory devices currently employ the DLL as the clock correction circuit, but a phase locked loop (PLL) may be used as the clock correction circuit 410 instead of the DLL.

Further details of the clock output circuit provided at an output terminal within the clock correction circuit and controlling the clocks RCLKDLL and FCLKDLL under the control of the clock enable signal CLKEN will be made later with reference to an accompanying drawing.

Those representative features described above may be separately applied or simultaneously applied.

To sum up, the semiconductor memory device in accordance with the embodiment of the present invention supplies output clocks (i.e., data output clocks RCLKDLL and FCLKDLL input to the data output units 461 to 476) for data output to a DQ peripheral circuit (i.e., the DQ peripheral circuit that performs domain crossing on a read command RDCMD using the output clocks RCLKDLL and FCLKDLL and outputs data) only in the read operation, besides an output clock (i.e., the clock RCLKDLL input to the domain crossing unit 420) required for domain crossing.

Accordingly, in accordance with the embodiment of the present invention, the DQ peripheral circuit of the semiconductor memory device is prevented from unnecessarily consuming current.

Figure 5:
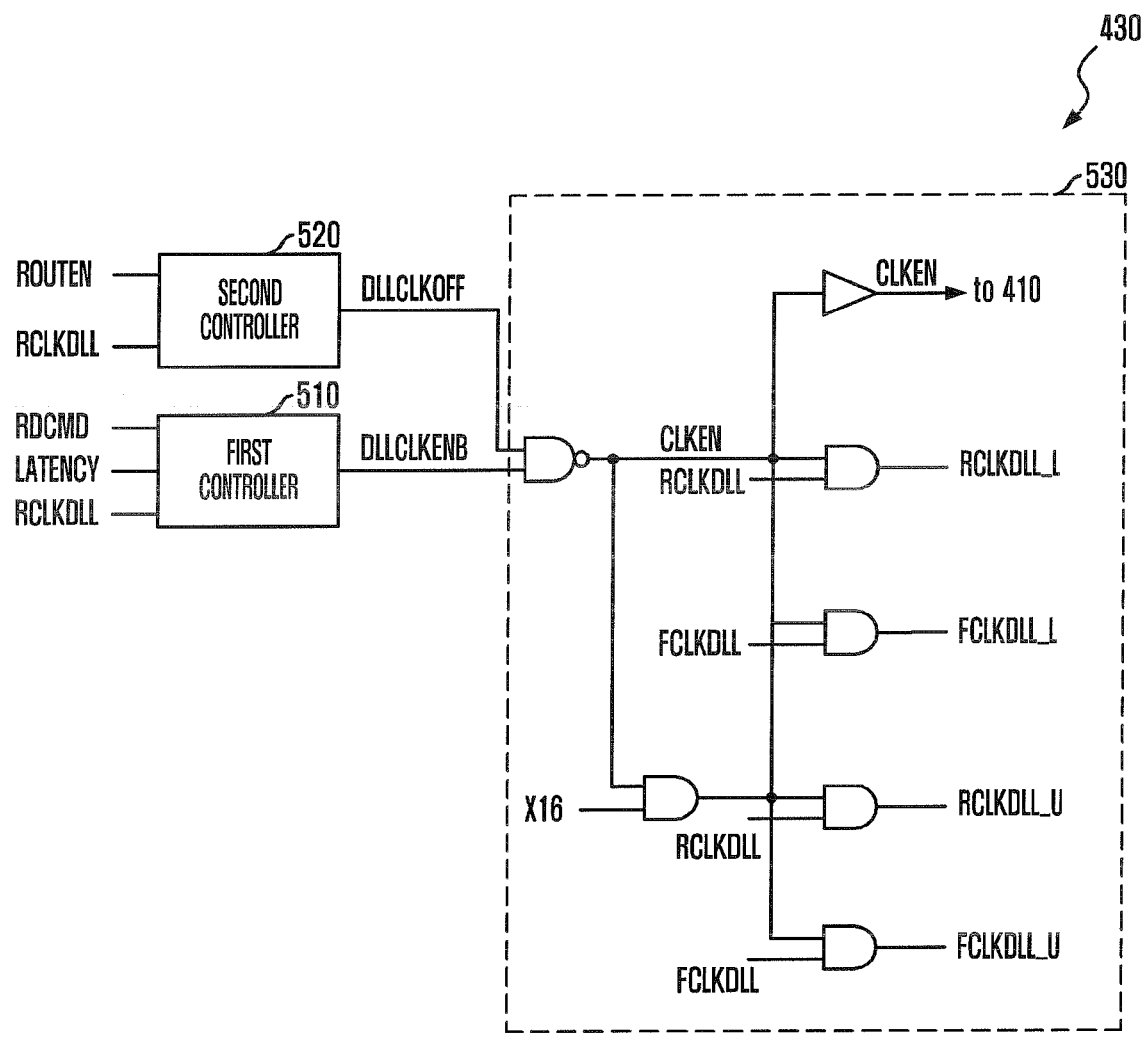
FIG. 5 is a block diagram of a clock control unit of FIG. 4.

FIG. 5 is a block diagram of the clock control unit 430 of FIG. 4.

The clock control unit 430 includes a first controller 510, a second controller 520, and a clock buffer 530.

The first controller 510 generates a first control signal DLLCLKENB for controlling data output clocks RCLKDLL and FCLKDLL to be transferred to the data output units 461 to 476 for a period required for data preparation in the read operation of the semiconductor memory device. The first controller 510 generates the first control signal DLLCLK-ENB using the read command RDCMD and the internal read command LATENCY. This is because the read command RDCMD and the internal read command LATENCY are signals making the semiconductor memory device perform a preparation operation such as data alignment for data output. The first control signal is enabled to logic 'LOW'.

The second controller 520 generates a second control signal DLLCLKOFF for controlling the data output clock RCLKDLL and FCLKDLL to be transferred to the data output units 461 to 476 while data is actually output in the read operation. The second controller 520 generates the second control signal DLLCLKOFF using the output enable signal ROUTEN. This is because the output enable signal ROUTEN is a signal that relates to timing when data is actually output from the semiconductor memory device. The second control signal is enabled to logic 'LOW'.

The clock buffer 530 determines whether to transfer the output clocks RCLKDLL and FCLKDLL in response to the first control signal DLLCLKENB and the second control signal DLLCLKOFF. The clock buffer 530 transfers the output clocks RCLKDLL and FCLKDLL to the data output unit 461 to 476 if at least one of the first control signal DLLCLKENB and the second control signal DLLCLKOFF is enabled to logic 'LOW'. The output clocks RCLKDLL and FCLKDLL are transferred through the first buffer unit 440 and the second buffer unit 450. However, if both the first control signal DLLCLKENB and the second control signal DLLCLKOFF are disabled to logic 'HIGH', the clock buffer 530 does not transfer the output clocks RCLKDLL and FCLKDLL to the data output units 461 to 476. That is, the clock buffer 530 transfers the output clocks RCLKDLL and FCLKDLL to the data output units 461 to 476 only while the semiconductor memory device is preparing the data output, i.e., the first control signal is enabled, or while the data is being actually output, i.e., the second control signal is enabled.

The operation of the clock buffer 530 will now be described. When both the first control signal DLLCLKENB and the second control signal DLLCLKOFF are disabled to logic 'HIGH', the clock enable signal CLKEN is disabled to logic 'LOW'. Accordingly, even if the output clock RCLKDLL and FCLKDLL toggle, clocks RCLKDLL_L, FCLKDLL_L, RCLKDLL_U and FCLKDLL_U cannot toggle.

If at least one of the first control signal DLLCLKENB and the second control signal DLLCLKOFF is enabled to logic 'LOW', the clock enable signal CLKEN is enabled to logic 'HIGH'. Accordingly, the output clocks RCLKDLL, FCLKDLL can be transferred as clocks RCLKDLL_L, FCLKDLL_L, RCLKDLL_U and FCLKDLL_U.

An X16 signal is a signal that is enabled in the case of an x16 mode, i.e., a mode in which data is output by using sixteen DQ pins. According to whether or not the X16 signal is enabled, it is determined whether the clock control unit 430 transfers the output clocks RCLKDLL and FCLKDLL only to the first buffer unit 440 or to both the first buffer unit 440 and the second buffer unit 450.

Figure 6:
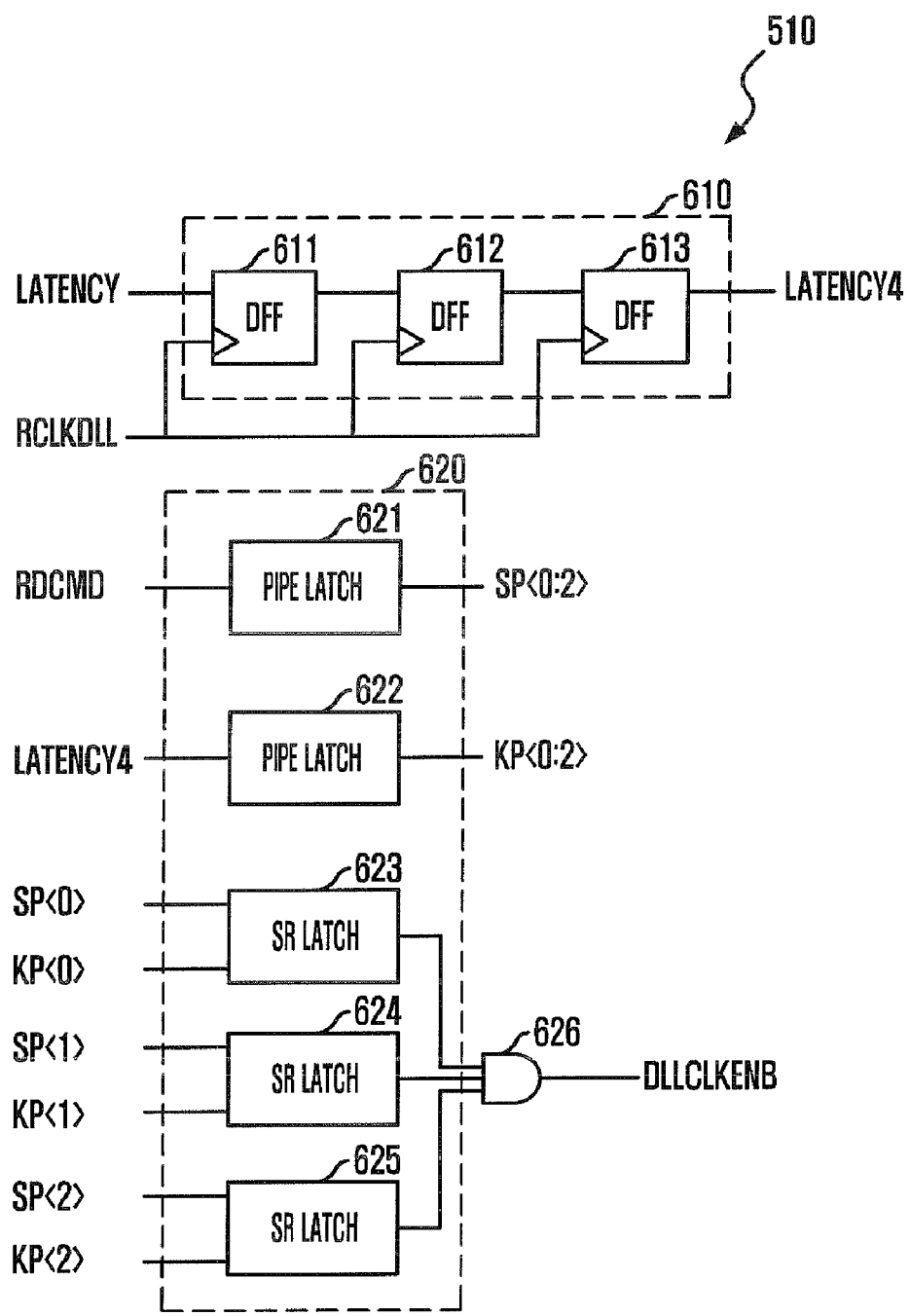
FIG. 6 is a block diagram of a first controller of FIG. 5.

FIG. 6 is a block diagram of the first controller 510.

The first controller 510 includes a shifting part 610 and a signal generation part 620. The shifting part 610 shifts an internal read command LANTENCY by a clock long enough to ensure a margin of the internal read command LATENCY and thus generates a shifted internal read command LATENCY4. The signal generation part 620 enables the first control signal DLLCLKENB in response to the read command RDCMD and disables the first control signal DLLCLKENB in response to the shifted internal read command LATENCY4.

The shifting part 610 includes D flip-flops 611, 612 and 613 connected in series. Each of the D flip-flops 611, 612 and 613 shifts an input signal by one clock and outputs a shifted signal. Thus, the internal read command LATENCY input to the shifting part 610 is shifted by three clock periods and becomes the shifted internal read command LATENCY4. The first control signal DLLCLKENB is enabled by the internal read command LATENCY and disabled by the shifted internal read command LATENCY4. Therefore, an enabling period of the first control signal DLLCLKENB is determined according to the number of clock periods by which the shifting part 610 shifts the internal read command LATENCY. For this reason, the number of D flip-flops 611, 612 and 613 in the shifting part 610 may be varied according to how great a margin needs to be put in the first control signal DLLCLK-ENB.

The signal generation part 620 may include two pipe latches 621 and 622, SR latches 623, 624 and 625 operating in response to outputs of the pipe latches 621 and 622, and an AND gate 626 generating the first control signal DLLCLK-ENB in response to output values of the SR latch 623, 624 and 625.

The pipe latches 621 and 622 alternately enable output signals SP<0:2> and KP<0:2> whenever the enabled input signals RDCMD and LATENCY4 are input. When the enabled read command RDCMD is first input to the pipe latch 621, an SP<0> signal is enabled to logic 'HIGH', and then when the enabled read command RDCMD is input, an SP<1> signal is enabled to logic 'HIGH'. That is, whenever the enabled read command read command RDCMD is input, SP<0:2> signals SP<0:2> are alternately enabled to logic 'HIGH'. Likewise, whenever the enabled shifted internal read command LATENCY4 is input to the pipe latch 622, KP<0:2> signals KP<0:2> are alternately enabled to logic 'HIGH'.

The SR latches 623, 624 and 625 each enable its output signal to logic 'LOW' when the SP signal enabled to logic 'HIGH' is input, and disables its output signal to logic 'HIGH' when the KP signal enabled to logic 'HIGH' is input. If at least one of output signals of the respective SR latches 623, 624 and 625 is enabled to logic 'LOW', the first control signal DLLCLKENB is enabled to logic 'LOW'.

The overall operation of the first controller 510 will now be described. First, description will be made for a simple case where one read command RDCMD is input. When the enabled read command RDCMD is input, the internal read command LATENCY is enabled, and the internal read command LATENCY4 shifted from the internal read command LATENCY is enabled. The read command RDCMD enables the SP<0> signal, and the shifted internal read command LATENCY4 enables the KP<0> signal. Accordingly, the first control signal DLLCLKENB is enabled from an enabling point of the SP<0> signal to an enabling point of the KP<0> signal.

Even if read commands RDCMD are consecutively input, a similar operation to the above-described operation is performed. The difference is that because the first control signal DLLCLKENB is disabled to logic 'LOW' when any one of output signals of the SR latches 623, 624 and 625 is enabled to logic 'LOW', the first control signal DLLCLKENB is enabled by the very first read command RDCMD and disabled by the last shifted internal read command LATENCY4.

To sum up, the first control signal DLLCLKENB is enabled by the read command RDCMD and disabled by the shifted internal read command LATENCY4. If read commands RDCMD are consecutively input, enabling periods of the first control signal DLLCLKENB enabled by each of the consecutive read commands RDCMD overlap each other. That is, if three read commands RDCMD are consecutively input, the first control signal DLLCLKENB is enabled by the first read command RDCMD and disabled by the third shifted internal read command LATENCY4.

For reference, the reason why the SR latches 623, 624 and 625 are used in the signal generation unit 620 is that the read command RDCMD, the internal read command LATENCY and the shifted internal read command LATENCY4 are pulse-type signals that are enabled only for a short period of time. Also, the three SR latches 623, 624 and 625 are used because, in general, about three read commands RDCMD can be consecutively input in one CAS latency (CL). If the CAS latency (CL) increases and thus more read commands can be consecutively input in the CAS latency (CL), the number of terminals within the SR latches 623, 624 and 625 and the pipe patches 621 and 622 must be increased (the number of SR latches increases, and the number of SP<0:N> signals and KP<0:N> signals increases).

The first controller 510 enables the first control signal DLLCLKENB from an enabling point of the read command RDCMD to an enabling point of the shifted internal read command LATENCY4. Accordingly, the first control signal DLLCLKENB can be enabled with a sufficient margin while the semiconductor memory device prepares data output.

Figure 7:
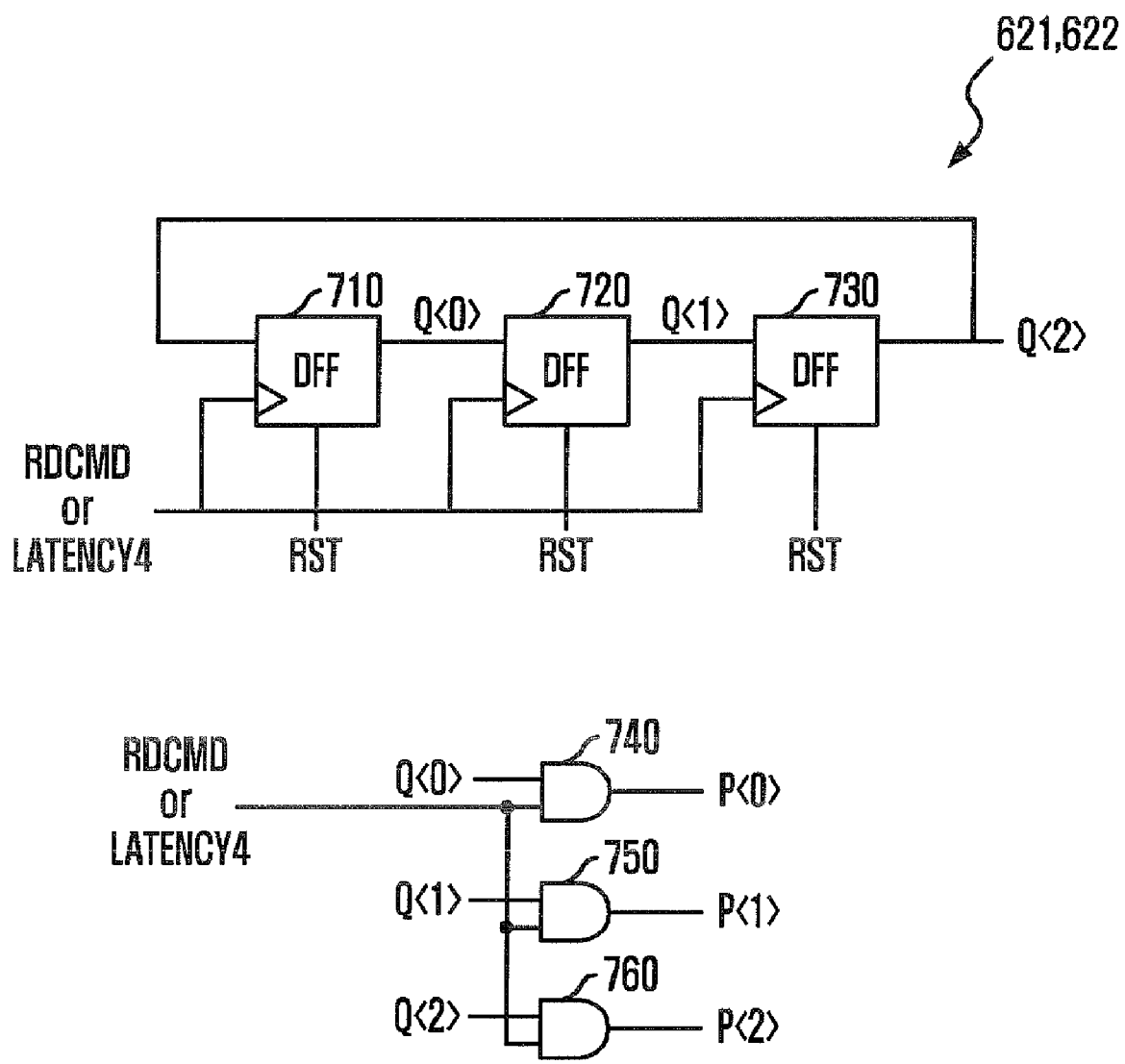
FIG. 7 is a block diagram of a pipe latch of FIG. 6.

FIG. 7 is a block diagram of each of the pipe latches 621 and 622 of FIG. 6.

Referring to FIG. 7, each of the pipe latches 621 and 622 includes D flip-flops 710, 720 and 730 connected in series, and AND gates 740, 750 and 760 for respectively performing an AND operation on output signals Q<0:2> of the D flip-flops 710, 720 and 730 and an input signal in order to output output signals P<0:2> of each of the pipe latches 621 and 622. Here, the input signal of the pipe latch 621 is the read command RDCMD and the input signal of the pipe latch 622 is the shifted internal read command LATENCY4, and the output signals of the pipe latch 621 are SP<0:2> signals and the output signals of the pipe latch 622 are KP<0:2> signals.

Whenever the input signals, i.e., the read command RDCMD for the pipe latch 621 and the shifted internal read command LATENCY4 for the pipe latch 622, are input, the output signals P<0:2> must be sequentially enabled. Thus, an initial value of the D flip-flop 710 is set to logic 'HIGH', and respective initial values of the D flip-flops 720 and 730 are set to logic 'LOW'.

Since the operations of the pipe latches 621 and 622 are described above, detailed description thereof is omitted.

Figure 8:
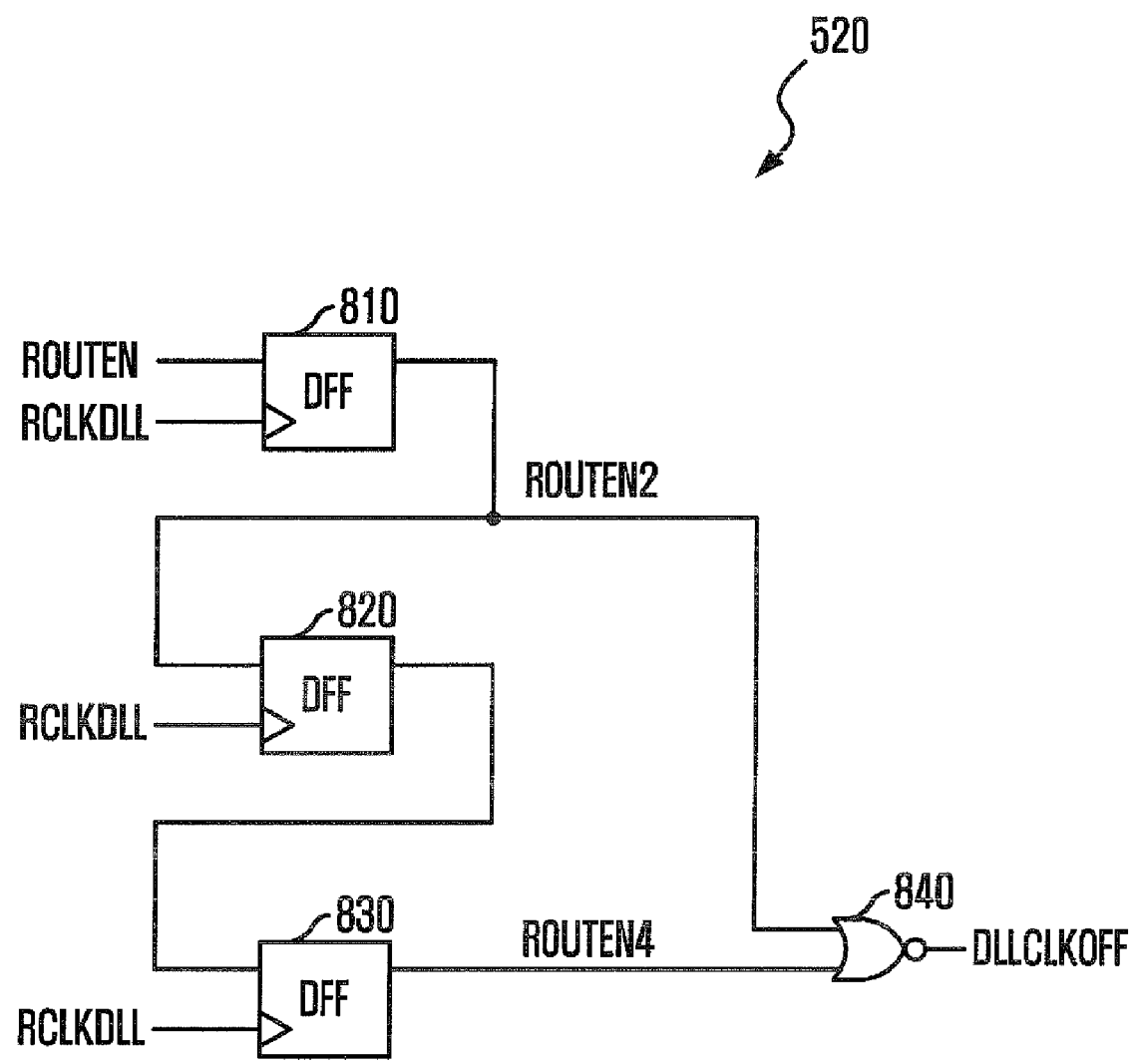
FIG. 8 is a block diagram of a second controller of FIG. 5.

FIG. 8 is a block diagram of the second controller 520 of FIG. 5.

Referring to FIG. 8, the second controller 520 includes D flip-flops 810, 820 and 830 connected in series, and a NOR gate 840 performing a NOR operation on shifted output signals ROUTEN2 and ROUTEN4 of the D flip-flops 810 and 830 to generate a second control signal DLLCLKOFF.

The D flip-flops 810, 820 and 830 shift an output enable signal ROUTEN with reference to a clock RCLKDLL. The D flip-flop 810 outputs the shifted output enable signal ROUTEN2 generated by shifting the output enable signal ROUTEN by one clock, and the D flip-flop 830 outputs the shifted output enable signal ROUTEN4 generated by shifting output enable signal ROUTEN by three clock periods. If at least one of the output enable signal ROUTEN2 and the output enable signal ROUTEN4 is enabled to logic 'HIGH', the second control signal DLLCLKOFF is enabled to logic 'LOW'.

As described above, the output enable signal ROUTEN is a signal associated with timing when the semiconductor memory device actually outputs data. The second controller 520 generates the output enable signals ROUTEN2 and ROUTEN4 shifted from the output enable signal ROUTEN by respective predetermined numbers of clock periods, and enables the second control signal DLLCLKOFF if at least one of the output enable signals ROUTEN2 and ROUTEN4 is enabled. Accordingly, the second control signal 520 can be enabled, ensuring a sufficient margin while the semiconductor memory device outputs data to the outside of a chip.

The number of clock periods by which the second controller 520 shifts the output enable signal ROUTEN to output shifted output enable signals, e.g., ROUTEN1 to ROUTEN5, and thus to generate the second control signal DLLCLKOFF, may be varied according to a width of a margin that must be ensured. That is, it is a matter of selection to determine the number of clock periods for the shift.

The second controller 520 generates the second control signal DLLCLKOFF with a sufficient margin by using the shifted output enable signals ROUEN2 and ROUTEN4. Accordingly, the second control signal DLLCLKOFF can be enabled with a sufficient margin while the semiconductor memory device actually outputs data to DQ pins.

Figure 9:
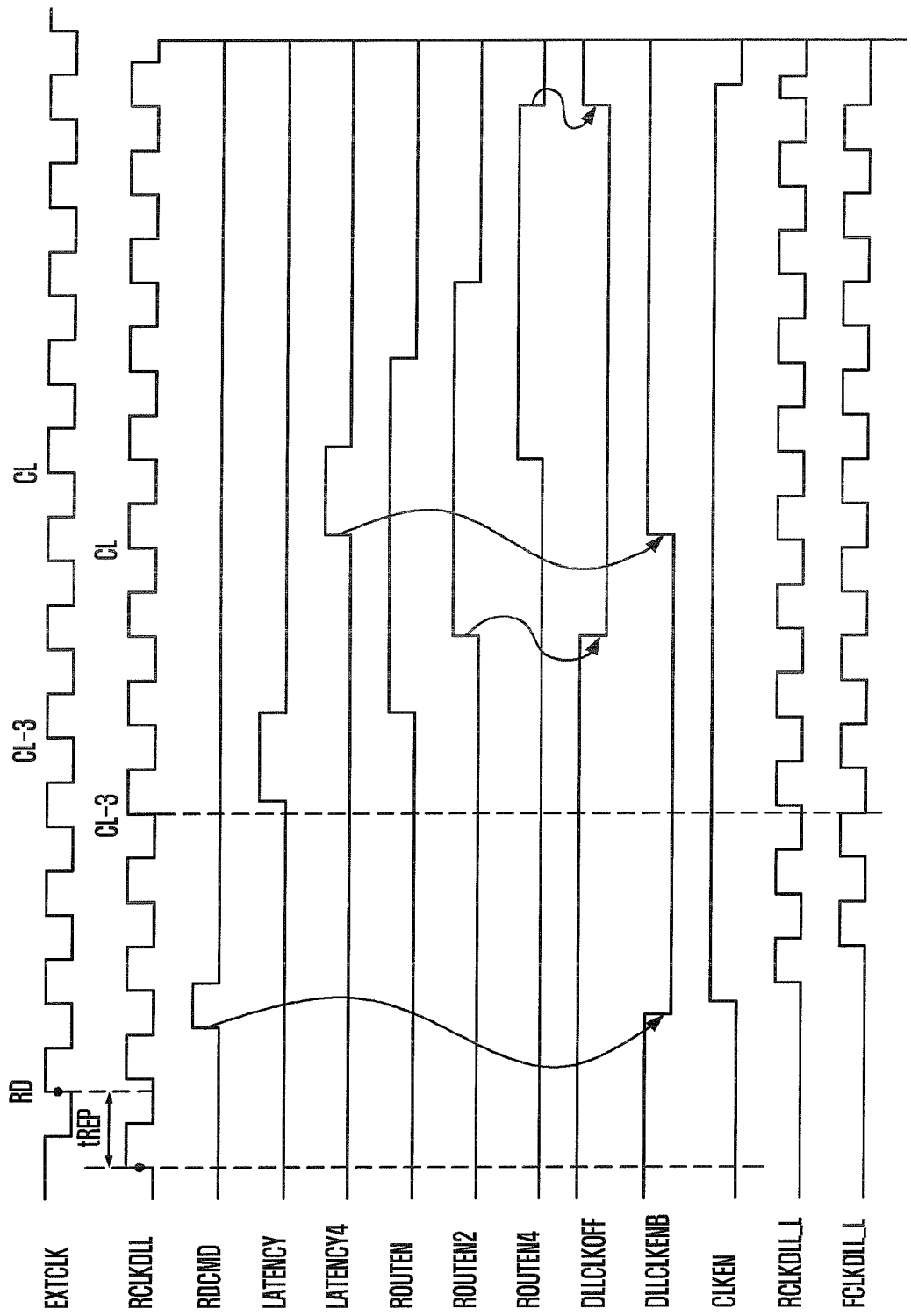
FIG. 9 is a timing diagram illustrating the operation of the clock control unit of FIG. 4.

FIG. 9 is a timing diagram illustrating the operation of the clock control unit 430 of FIG. 4.

In FIG. 9, an operation is illustrated in the case where a CAS latency is 7 (CL=7), a burst length is 8(BL=8), and an internal read command LATENCY is enabled at a point of CL-3, i.e., enabled four clock periods after the read command RDCMD is input.

First, when the read command RDCMD is applied, the first control signal DLLCLKENB is enabled to logic 'LOW' in response to the read command RDCMD. The first control signal DLLCLKENB maintains its enabled state until the shifted internal read command LATENCY4 is enabled. An external read command RD is delayed for tREP to be generated the read command RDCMD. tREP means replica delay time in FIG .2.

The output enable signal ROUTEN is enabled by the internal read command LATENCY, and thus the shifted output enable signals ROUTEN2 and ROUTEN4 are also enabled. While the shifted output enable signal ROUTEN2 or ROUTEN4 is enabled, the second control signal DLLCLKOFF maintains its enabled state.

While the first control signal DLLCLKENB or the second control signal DLLCLKOFF is enabled to logic 'LOW', the clock enable signal CLKEN is enabled to logic 'HIGH'. While the clock enable signal CLKEN is enabled to logic 'HIGH', the output clocks RCLKDLL_L and FCLKDLL_L are output, toggling in the clock control unit 430.

While both the first control signal DLLCLKENB and the second control signal DLLCLKOFF are enabled to logic 'HIGH', the clock enable signal CLKEN is disabled to logic 'LOW', and then the output clocks RCLKDLL_L and FCLKDLL_L output from the clock control unit 430 do not toggle.

Figure 10:
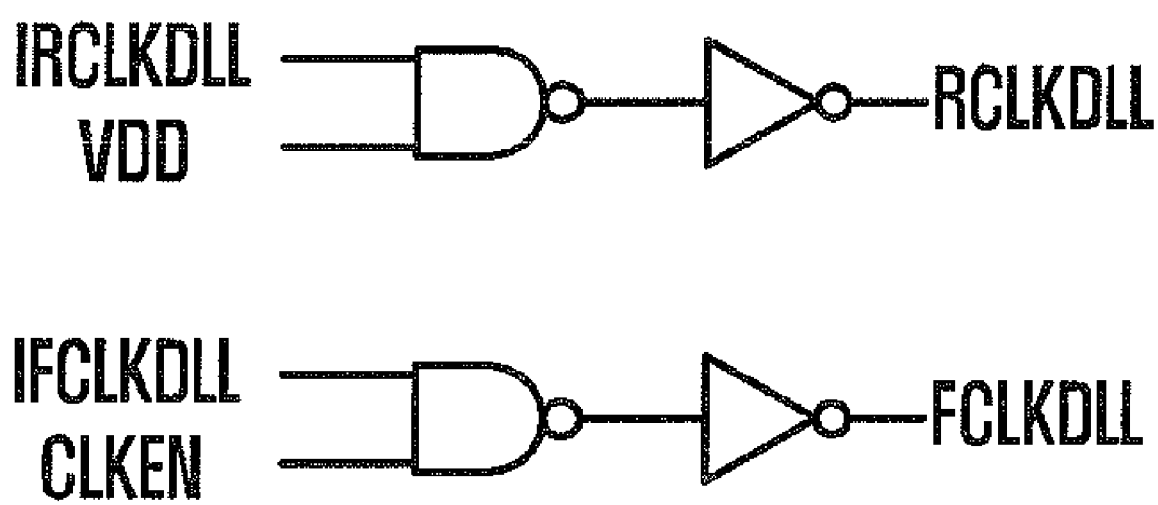
FIG. 10 is a diagram illustrating a clock output circuit controlling a clock being output within a clock correction circuit of FIG. 4.

FIG. 10 is a diagram illustrating the clock output circuit that controls the clocks RCLKDLL and FCLKDLL within the clock correction circuit 410 of FIG. 4.

The clock output circuit is provided at an output terminal of the clock correction circuit 410, and controls the clocks RCLKDLL and FCLKDLL being output. The clock output circuit operates under the control of the supply voltage VDD and the clock enable signal CLKEN generated from the clock control unit 430.

While the clock enable signal CLKEN is enabled to logic 'HIGH' in a read operation, a rising clock IRCLKDLL and falling clock IFCLKDLL generated from the clock correction circuit 410 are output to the outside (IRCLKDLL=RCLKDLL, and IFCLKDLL=FCLKDLL).

However, while the clock enable signal CLKEN is disabled to logic 'LOW', in an operation other than the read operation, the rising clock IRCLKDLL generated from the clock correction circuit 410 is output to the outside (IRCLKDLL=RCLKDLL), but the falling clock IFCLKDLL is not output to the outside of the clock correction circuit 410. That is, the falling clock FCLKDLL do not toggle and is fixed to logic 'LOW'.

Accordingly, in operations which are not the read operation, the semiconductor memory device in accordance with the embodiment of the present invention controls a clock FCLKDLL not to output from the clock correction circuit, except for a clock RCLKDLL required for domain crossing, so that current consumption thereof can be additionally reduced (see the description associated with the second feature of FIG. 4).

An operation of the semiconductor device will now be described with reference to FIGS. 4 to 9.

A method for operating the semiconductor memory device, in accordance with an embodiment of the present invention includes receiving a read command RDCMD; using the received read command RDCMD to define a period of preparing data output and a period of outputting data to the outside of the semiconductor memory device as a period of providing output clocks RCLKDLL_L, FCLKDLL_L, RCLKDLL_U, and FCLKDLL_U; and supplying the output clocks RCLKDLL_L, FCLKDLL_L, RCLKDLL_U and FCLKDLL_U for the data output during the defined period.

The defining of the periods may include defining a first period for data preparation, which is an enabling period of the first control signal DLLCLKENB, using the read command RDCMD and the internal read command LATENCY generated by domain crossing of the read command RDCMD; defining a second period for data output, which is an enabling period of the second control signal DLLCLKOFF, using the output enable signal ROUTEN which is enabled for a period as long as a burst length after a predetermined number of clock periods pass after the internal read command LATENCY is enabled; and defining a total period of the first period and the second period, i.e., an enabling period of the clock enable signal CLKEN, as a period of supplying the output clocks RCLKDLL_L, FCLKDLL_L, RCLKDLL_U and FCLKDLL_U.

The semiconductor memory device in accordance with the embodiment of the present invention supplies a clock to the data output unit only during a read operation, thereby preventing unnecessary current consumption caused by clock toggling in a period where a clock is not used.

While the present invention has been described with respect to the specific embodiments, it will be apparent to those skilled in the art that various changes and modifications may be made without departing from the spirit and scope of the invention as defined in the following claims.

Particularly, it is obvious that signals other than the signals described above may be used according to design and a margin required for a read operation since an aspect of the present invention relates to reducing current consumption by supplying an output clock for data output to a data output unit only in the read operation for which the output clock is actually required.

What is claimed is:

1. A semiconductor memory device, comprising:
a data output unit configured to output data in synchronization with a data output clock; and
a clock control unit configured to selectively transfer the data output clock to the data output unit under the control of a read command and an internal read command generated by domain-crossing of the read command,
wherein the clock control unit comprises:
a first controller configured to generate a first control signal for controlling the data output clock to be transferred to the data output unit using the read command and the internal read command;
a second controller configured to generate a second control signal for controlling the data output clock to be transferred to the data output unit using an output enable signal; and
a clock buffer configured to receive the first control signal and the second control signal and to transfer the data output clock to the data output unit in response to the first control signal and the second control signal.

2. The semiconductor memory device as recited in claim 1, wherein the clock control unit is configured to transfer the data output clock while the semiconductor memory device prepares output of the data and the data is output to the outside of the semiconductor memory device.

3. The semiconductor memory device as recited in claim 2, wherein the clock control unit is configured to ensure a predetermined margin at the time when the data output clock is output.

4. The semiconductor memory device as recited in claim 1, wherein the first controller is configured to generate the first control signal using the read command and the internal read command generated by domain-crossing of the read command.

5. The semiconductor memory device as recited in claim 4, wherein the first controller comprises:
a shifting part configured to shift the internal read command by a clock to ensure a margin to generate a shifted internal read command; and
a signal generation part configured to enable the first control signal in response to the read command and disable the first control signal in response to the shifted internal read command.

6. The semiconductor memory device as recited in claim 5, wherein the signal generation part is configured to enable the first control signal from an enabling time point of an initial read command to an enabling time point of a final shifted internal read command.

7. The semiconductor memory device as recited in claim 4, wherein the second controller is configured to generate the second control signal using an output enable signal which is enabled for a period as long as a burst length after a predetermined clock elapses after the internal read command is enabled.

8. The semiconductor memory device as recited in claim 7, wherein the second controller is configured to disable the second control signal when a shifted signal generated by shifting the output enable signal by a predetermined clock and another shifted signal generated by further shifting the shifted signal by the predetermined clock are disabled.

9. The semiconductor memory device as recited in claim 1, wherein the data output unit is provided for each data pin.

10. A semiconductor memory device, comprising:
   a clock correction circuit configured to output a rising clock and a falling clock, wherein one of the rising clock and the falling clock is selectively output under the control of a read command;
   a data output unit configured to output data in synchronization with a data output clock;
   a clock control unit configured to selectively transfer the rising clock and the falling clock to the data output unit as the data output clock, under the control of the read command; and
   a domain crossing unit configured to synchronize the read command synchronized with an external clock with the rising clock to output an internal read command if the clock correction circuit selectively outputs the falling clock.

11. The semiconductor memory device as recited in claim 10, wherein the domain crossing unit is configured to synchronize the read command synchronized with an external clock with the falling clock to output an internal read command if the clock correction circuit selectively outputs the rising clock.

12. The semiconductor memory device as recited in claim 10, wherein the clock control unit is configured to transfer the rising clock and the falling clock as the data output clock while the semiconductor memory device prepares output of the data and the data is output to the outside of the semiconductor memory device.

13. The semiconductor memory device as recited in claim 10, wherein the clock correction circuit is configured to output both the rising clock and the falling clock while the semiconductor memory device prepares output of the data and the data is output to the outside of the semiconductor memory device.

14. The semiconductor memory device as recited in claim 10, wherein the data output unit is provided for each data pin.

15. A semiconductor memory device, comprising:
   a data output unit configured to output data in synchronization with a data output clock; and
   a clock control unit configured to selectively transfer the data output clock to the data output unit under the control of a read command, an internal read command and an output enable signal;
   a domain crossing unit configured to synchronize the read command synchronized with an external clock with a rising clock to output the internal read command; and
   an output enable signal generation unit configured to receive the internal read command and to generate the output enable signal in response to the internal read command.

16. The semiconductor memory device as recited in claim 15, wherein the output enable signal is enabled after being delayed by a predetermined clock after the internal read command is enabled.

17. The semiconductor memory device as recited in claim 15, wherein the clock control unit comprises:
   a first controller configured to generate a first control signal for controlling the data output clock to be transferred to the data output unit using the read command and the internal read command;
   a second controller configured to generate a second control signal for controlling the data output clock to be transferred to the data output unit using an output enable signal; and
   a clock buffer configured to receive the first control signal and the second control signal and to transfer the data output clock to the data output unit in response to the first control signal and the second control signal.

* * * * *